United States Patent [19]

Shigaki et al.

[11] Patent Number: 4,612,514
[45] Date of Patent: Sep. 16, 1986

[54] FEEDBACK AMPLIFIER

[75] Inventors: Masafumi Shigaki, Kawasaki; Yukio Takeda, Zama, both of Japan

[73] Assignee: Fujitsu Limited, Kawasaki, Japan

[21] Appl. No.: 593,428

[22] Filed: Mar. 26, 1984

[30] Foreign Application Priority Data

Apr. 8, 1983 [JP] Japan ................... 58-61761

[51] Int. Cl.[4] .................... H03F 3/16; H03G 3/30
[52] U.S. Cl. ..................... 330/277; 330/282; 330/290; 330/293
[58] Field of Search ............ 330/85, 86, 277, 282, 330/290, 293

[56]  References Cited

U.S. PATENT DOCUMENTS 4,264,874  4/1981  Young .......................... 330/277

OTHER PUBLICATIONS

Boornard et al, "Low-Noise Integrated Silicon-Gate FET Amplifier", IEEE Journal of Solid-State Circuits, Dec. 1975, pp. 542-544.
Tomasetta, "GaAs Optical Electronic Devices for Signal Processing Applications", Conference: Proceedings of the Society of Photo-Optical Instrumentation Engineers, Washington, D.C., Apr. 17-18, 1979, pp. 111-114.
T. Nakamura et al, "GaAs Monolithic Buffered Feedback Amplifier Using Au/WSi Gate", Natnl. Conf. of Semiconductor Devices & Material of IECE of Japan, pp. 1-78, 1960.
Y. Daido et al., "GaAs Monolithic Amplifier and Voltage Controlled Oscillator", IECEJ Tech. Depart. SSD82-121 on Semiconductor Devices, pp. 9-11.

Primary Examiner—James B. Mullins
Attorney, Agent, or Firm—Staas & Halsey

[57] ABSTRACT

A feedback amplifier circuit includes an inversion circuit, a level shift circuit, and a feedback resistive element. The inversion circuit includes an input active element and a load element connected in cascade with respect to a voltage source. The level shift circuit includes a field effect transistor having a gate connected to the output of the inversion circuit, a diode or diodes, a constant current active load connected in cascade with respect to the voltage source, and the feedback resistive element is connected between the output of the level shift circuit and the input of the inversion circuit.

5 Claims, 15 Drawing Figures

FEEDBACK AMPLIFIER

BACKGROUND OF THE INVENTION

1. Field of the Invention

The present invention relates to a feedback amplifier, and more particularly, to an amplifier which uses an inverter comprising a field effect transistor (hereinafter referred to as a FET) and which can be integrated onto a gallium arsenide (GaAs) substrate or the like.

2. Description of the Prior Art

The configurations of feedback amplifiers used as microwave amplifiers are shown in the following prior art references:

(a) W. O. Camp et al "2~6 GHz Monolithic Microwave Amplifier" IEEE, Monolithic Circuits Symposium Digest 1983, pp 76~80;

(b) P. N. Rigby et al "Broadband Monolithic Low-Noise Feedback Amplifiers", IEEE, Monolithic Circuits Symposium Digest 1983, pp 71~75;

(c) K. Honjo et al "Ultra-Broad-Band GaAs Monolithic Amplifier", IEEE, MTT-30, Vol. 7, 1982, pp 27~1033;

(d) Nishimura et al "GaAs Monolithic IC Ultra-Wideband Low-noise Amplifier" Document SSD80-90 of the Meeting for the Study of Semiconductors and Transistors of the Institute of Electronics and Communication Engineers of Japan, pp 25~p 30;

(e) Nishiuma et al "Low-dissipation, and Low-noise GaAs Monolithic Amplifier Using New Feedback System", Document MW-82-109 of the Meeting for the Study of Micro-waves of the Institute of Electronics and Communication Engineers of Japan, pp 27~32;

(f) Shigaki et al "GaAs Monolithic Amplifier and Oscillator" Document SSD 83-130 of the Meeting for the Study of Semiconductors and Transistors of the Institute of Electronics and Communication Engineers of Japan, pp 55~62; and (g) M. Abe et al "New Technology Towards GaAs LSI/VLSI for computer Application", IEEE, MTT-30, No. 7, July, 1982, pp. 992~998.

In the above-mentioned prior art, reference (a) discloses a monolithic microwave feedback amplifier having a frequency band of 2~6 GHz, reference (b) discloses a wideband monolithic low-noise feedback amplifier having a frequency band of 0.6~6 GHz, and references (c), (d), (e), and (f) also disclose a microwave feedback amplifier which is used in a GHz frequency range. Reference (g) discloses a technique by which a high frequency amplifier is realized by using a fully implanted planar GaAs metal semiconductor FET (MESFET).

In the microwave feedback amplifier disclosed in the above-mentioned references (a) to (f), an output from an output terminal is fed back to an input terminal through a feedback resistor and a capacitor. Moreover input and output capacitors are necessary, because the gate and drain have a constant bias voltage, and the bias voltage has to be separated from input and output DC voltage.

In the conventional feedback amplifier described above, feedback through the capacitor is performed to cancel the drain-gate potential difference across the input terminal and the output terminal. When an operating frequency is relatively high, the capacity of the capacitor can be relatively small. However, when the circuit is operated at a low frequency, for example, a frequency falling within the microwave frequency band, a capacitor having a large capacitance is required. In view of this, when the feedback amplifier as described above is formed on a GaAs integrated circuit (IC) or the like, sometimes a feedback capacitor must be externally connected to the IC. As is well known, when some parts of a circuit are separately and externally mounted to an IC, floating factors are introduced into the circuit. This is not preferable when the operating characteristics of the circuit need to be maintained.

When such a capacitor is formed on the same substrate on which the IC is formed, most of the chip area is occupied by the capacitor. Moreover, the capacitance of a capacitor which can be formed on a general square substrate having a side of several millimeters, is about 100 pF at most. Accordingly, it is impossible to obtain a feedback amplifier which can operate at a frequency of several tens of megahertz or lower.

SUMMARY OF THE INVENTION

An objective of the present invention is to provide a feedback amplifier which does not require a capacitor to be included in the feedback path of the input and output terminals as described above.

Another object of the present invention is to provide a feedback amplifier having a high and stable performance which can be formed on a GaAs IC.

The above-mentioned objects can be achieved by providing a feedback amplifier comprising an inversion circuit in which an input active element and a load element are connected in cascade with respect to an electric source, and a level shift circuit in which a field effect transistor has a base connected to the output of the inversion circuit. A diode or diodes and a constant current active load are connected in cascade with respect to the electric source, and a feedback resistive element is connected between the output of the level shift circuit and the input of the inversion circuit.

Further features and advantages of the present invention will be apparent from the ensuing description with reference to the accompanying drawings to which, however, the scope of the invention is in no way limited.

DESCRIPTION OF THE PREFERRED EMBODIMENTS

Figure 1A:
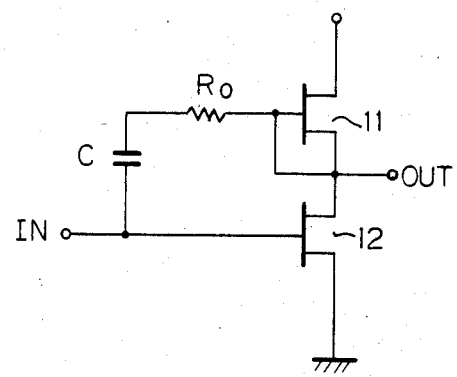
FIGS. 1A and 1B are circuit diagrams of examples of conventional feedback amplifiers.
Figure 1B:
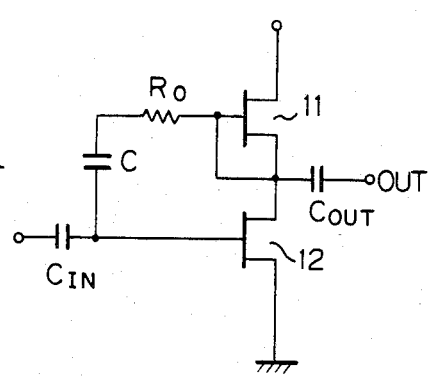

FIGS. 1A and 1B show the configuration of conventional feedback amplifiers. Referring to FIG. 1, FET's 11 and 12 constitute an inverter. An output from an output terminal OUT is fed back to an input terminal IN through a feedback resistor $R_0$ and a capacitor C.

As already mentioned, when such a capacitor is formed on the same substrate on which the IC is formed, most of the chip area is occupied by the capacitor. Moreover, the capacitance of a capacitor, which can be formed on a general square substrate having a side of several millimeters, is about 100 pF at most. Accordingly, it is impossible to obtain a feedback amplifier which can operate at a frequency of several tens of megahertz or lower.

Figure 2:
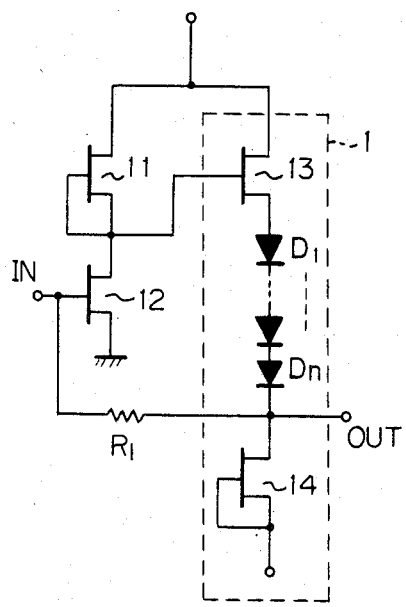
FIG. 2 is a circuit diagram of a first embodiment of the feedback amplifier according to the present invention.

FIG. 2 is a circuit diagram of an embodiment of the present invention. Referring to FIG. 2, reference numeral 1 denotes a level shifter comprising of an FET 13, a plurality of series-connected diodes $D_1$ to $D_n$ and a constant current load 14. The same reference numerals as in FIG. 1 denote the same parts in FIG. 2.

In the circuit shown in FIG. 2, an output from an inverter formed by FET's 11 and 12 is decreased to the same level as that of the input voltage, by the level shifter 1, and is then fed back to the input terminal through a feedback resistor $R_1$. Since there is no potential difference between the input and output terminals, a capacitor for separating the D.C. component need not be inserted in the feedback path.

The voltage shift amount to be made by the level shifter 1 can be determined in accordance with the number of diodes D used, and the like. Depending upon the levels of the circuit of the next stage, an output from any one of the diodes may be used.

Figure 3:
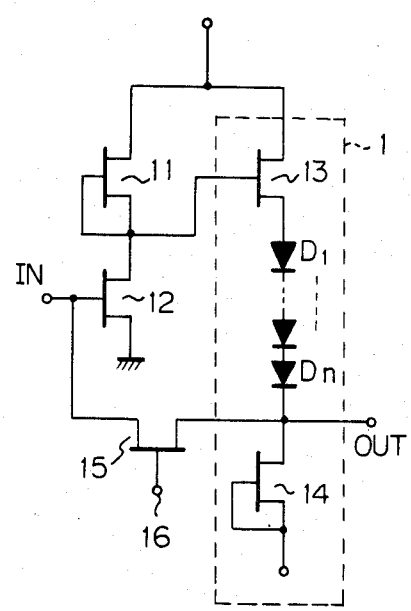
FIG. 3 is a circuit diagram of a second embodiment of the feedback amplifier according to the present invention.

FIG. 3 is another embodiment of the present invention. In this embodiment, an FET 15 is used in place of the resistor $R_1$ show in FIG. 2 as a resistive load inserted in the feedback path.

In the embodiment shown in FIG. 3, the resistance of the feedback resistor can be changed in accordance with a control voltage applied to a gate terminal 16 of the transistor 15. If the resistance of the feedback resistor is fixed, the gate terminal 16 is connected to the input terminal IN.

Figure 4A:
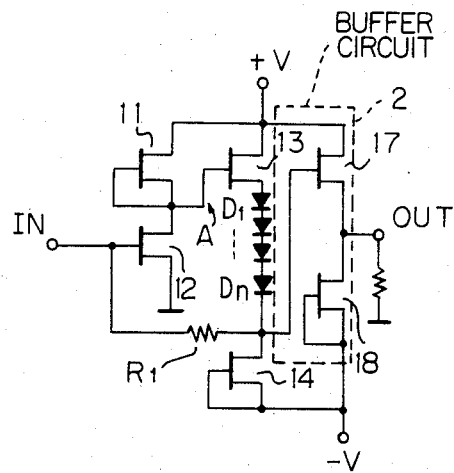
FIGS. 4A and 4B are circuit diagrams of a third embodiment of the feedback amplifier according to the present invention.
Figure 4B:
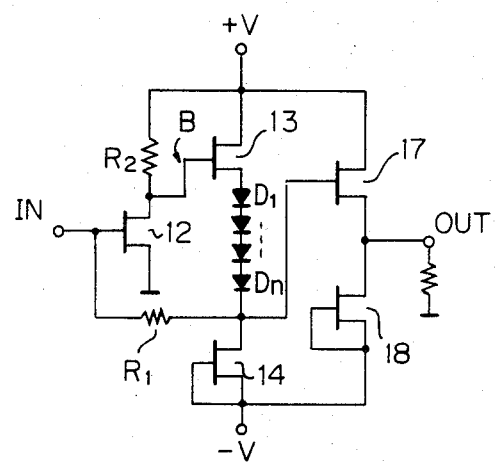

In the embodiment shown in FIG. 4A, a buffer circuit 2 which includes FET's 17 and 18 is connected to the output of the feedback amplifier, and in the embodiment shown in FIG. 4B, a resistor $R_2$ is used in place of the FET 11 shown in FIGS. 2 and 3.

A negative feedback amplifier which uses an active resistor has a very high gain, but a narrow bandwidth, and a negative feedback amplifier which uses a passive resistor has a low gain, but a wide bandwidth. For example, the gain and the bandwidth of the feedback amplifier shown in FIG. 4A can be calculated as follows.

When an FET has a gate length of 1 $\mu$m and a saturation characteristic of a current Ids (unit ampere A) between the drain and source; which is given by the following equation, $$Ids = 0.000075W(Vgs+0.8)(1+0.16\ Vds)\tanh 2.5\ Vds$$

the gain and bandwidth for providing an input gate width of 160 $\mu$m, a level shift gate width of 80 $\mu$m, and an output buffer gate width of 400 $\mu$m, are 15.6 dB and 3.5 GHz, respectively.

In the above equation, W is the gate width ($\mu$m), Vsg is the gate-source voltage (V), and Vds is the source-drain voltage (V).

When the amplifiers are connected in cascade, an input/output impedance is set at 50 $\Omega$. Since the load is an active resistor 11, the load cannot be changed, and gains and bandwidth other than the above values cannot be obtained.

Accordingly, a negative feedback amplifier having, for example, a gain of 10 dB and a bandwidth of 5 GHz cannot be designed.

In an amplifier wherein the load is not an active resistor but is a passive resistor $R_2$ as shown in FIG. 4B, if the resistance of the resistor $R_2$ is properly selected, a gain of 6.5 dB and a bandwidth of 8 GHz can be obtained under the same conditions as those described above.

If the resistances of the passive resistor $R_2$ and a feedback resistor $R_1$ are selected properly, desired characteristics can be obtained with different bandwidths and gains. The resistance of the passive resistor $R_2$ must be increased to obtain a given gain.

However, in this case, a voltage drop across the passive resistor $R_2$ is increased. This means that a voltage applied to the FET 12 becomes low, and satisfactory characteristics cannot be obtained. In order to resolve this problem, a power supply voltage must be increased. However, if the power supply voltage is fixed, an amplifier with desired characteristics cannot be designed. It is also impractical to unlimitedly increase the power supply voltage in practical designing procedures.

Figure 5:
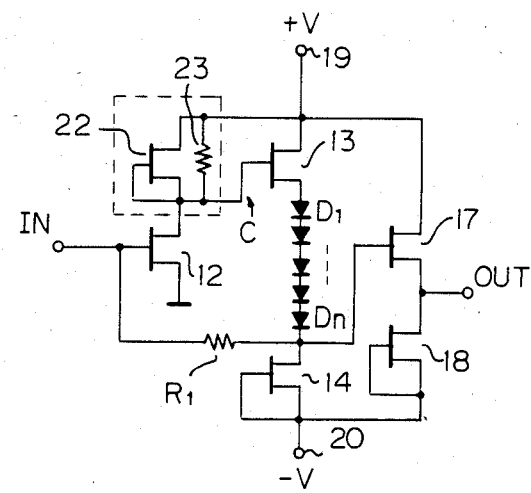
FIG. 5 is a circuit diagram of a fourth embodiment of the feedback circuit according to the present invention.

These drawbacks can be removed by using an improved circuit shown in FIG. 5.

As shown in FIG. 5, a parallel circuit of an active resistor 22 and a passive resistor 23 as a load of an FET 12 is connected between a power supply terminal 19 and the drain of the FET 12.

When such a load is used, a current flowing in the FET 12 forming the amplifier also flows to the active resistor 22. The high impedance of the active resistor 22 is reduced by the passive resistor 23, to provide a desired gain.

Although a predetermined voltage is applied to the FET 12 from the power supply terminal 19 through the active resistor 22, a voltage drop across the resistor 22 is substantially zero and a sufficiently high current flows to the FET 12.

Assuming that the passive resistor 23 has a resistance of 500 $\Omega$ and a resistor $R_1$ has the resistance of 250 $\Omega$, then a gain of 10.3 dB is obtained within a bandwidth of 5 GHz.

To compare a voltage applied to the FET in the circuit of the present invention with that in FIGS. 4A and 4B, a voltage of 2.5 V is applied at a point A in FIG.

4A, a voltage of 2.3 V is applied at point B in FIG. 4B, and a voltage of 3.6 V is applied at point C in FIG. 5. Thus, a sufficiently high voltage is applied to the FET 12.

In the circuit configurations shown in FIGS. 4A and 4B, it is difficult to set a gain of 10 dB. However, this can be achieved with the circuit shown in FIG. 5.

Figure 6:
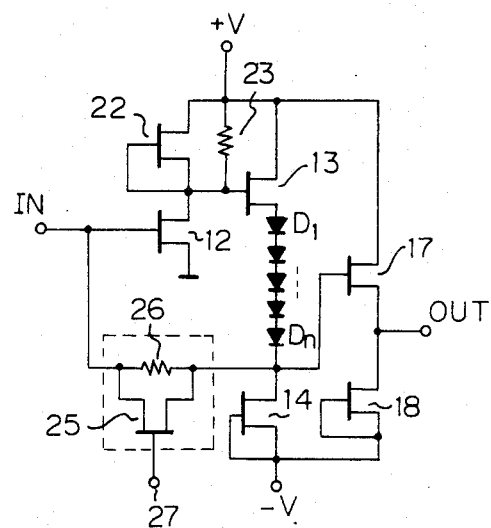
FIG. 6 is a circuit diagram of a fifth embodiment of the feedback amplifier according to the present invention.

In the circuit shown in FIG. 6, a parallel circuit of an active resistor 25 and a passive resistor 26 is connected as a feedback resistive element in place of the resistor $R_1$ in the circuit shown in FIG. 5.

When the feedback circuit comprises a parallel circuit of the active resistor 25 and the passive resistor 26, a variable gain amplifier is obtained wherein, if the voltages applied to terminals 27 of the feedback circuit are changed, the resistance of the feedback circuit is changed, and the feedback amount is changed accordingly. If the resistance of the passive resistor is set to be higher than that of the active resistor, fine adjustments of the feedback amount can be carried out.

Figure 7:
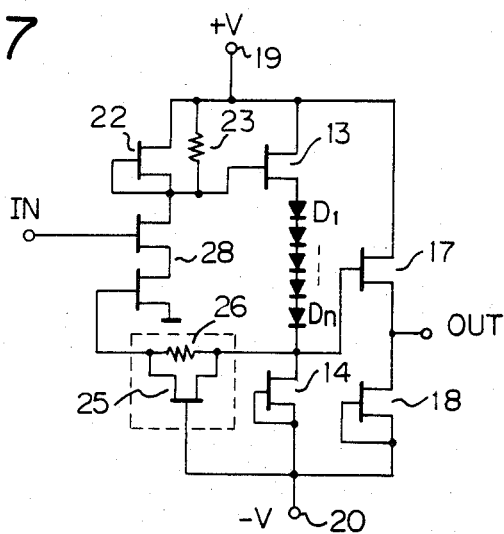
FIG. 7 is a circuit diagram of a sixth embodiment of the feedback amplifier according to the present invention.

FIG. 7 is a circuit diagram of dual-gate FET 28 having two gates. The feedback circuit is connected to the second gate at the input side. An input terminal is connected to the first gate. The circuit shown in FIG. 7 is a modification of that shown in FIG. 6 and functions in a similar manner.

However, in the circuits shown in FIGS. 5 to 7, a problem arises wherein the output level must be set precisely without changing the gain of the amplifier. For example, in the amplifier shown in FIG. 6, the potential of the gate of the transistor 13 may become slightly higher than the potential at the connection point of the transistor 13 and the diode $D_1$, therefore there is a danger that the current will flow into the gate of the transistor 13. Assuming that the gate width of the transistor 12 is 200 μm, the gate widths of the transistor 13 and diodes $D_1$ to $D_n$ are 80 μm, the gate lengths of transistors 12 and 13 are 1.5 μm, the gate lengths of the diodes $D_1$ to $D_n$ are 4 μm, and the electric source voltage +V is 5 V and the −V is −4 V, then the gate potential of the transistor 13 becomes 3.50 volts, the source potential of the transistor 13 becomes 3.34 volts, and the gate potential of the transistor 17 becomes 0.16 volts. That is, the gate potential of the transistor 13 becomes higher than the source potential of the transistor 13, so that there is a danger that the gate current may flow. Preferably, the DC potential at a connection point between the diode $D_n$ and the drain of the transistor 14, that is, the gate potential of the transistor 17, should be zero volts.

Figure 8:
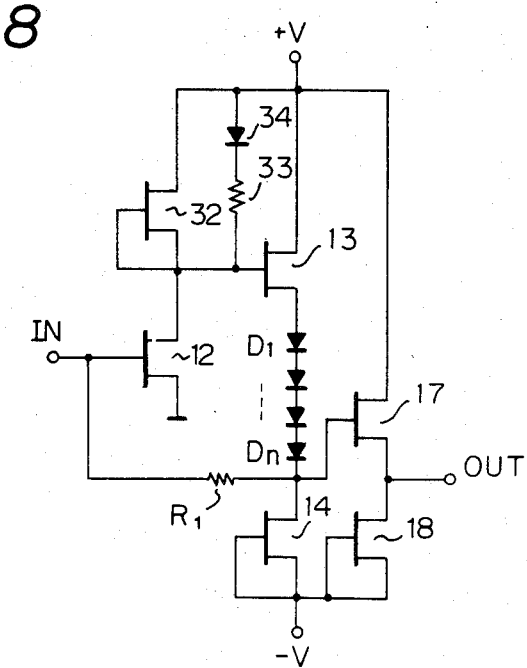
FIG. 8 is a circuit diagram of a seventh embodiment of the feedback amplifier according to the present invention.

The circuit which can satisfy the above-mentioned requirements is shown in FIG. 8. In FIG. 8, the load circuit comprises a series circuit of a resistor 33 and a diode 34, and a transistor 32 connected in parallel with the series circuit. Because the diode 34 is connected in series with the resistor 33, the gate potential of the transistor 13 falls slightly, and the gate potential of the transistor 17 can be set to a value of approximately 0 volts.

As in FIG. 6, the calculation is effected by assuming the gate width of the diode 34 is 60 μm, thus the gate potential of the transistor 13 becomes 3.2612 volts, the source potential of the transistor 13 becomes 3.1627 volts, and the gate potential of the transistor 17 becomes −0.0067 volts. That is, the potential difference between the gate and the source of the transistor 13 becomes smaller than the potential difference of 0.16 volts between the gate and the source of the transistor 13 in FIG. 6, and the gate potential of the transistor 17 becomes approximately zero volts. In this case, the bandwidth of the frequency does not change, and the gain changes only slightly by 0.2 dB.

Thus it is clear that, by connecting the diode 34 in series with the resistor 33, the DC potential at the gate of the transistor 17 can be adjusted by a smaller step than a forward voltage of one diode of the diodes $D_1$ to $D_n$, for example, 0.8 volts, and the DC potential level at the gate of the transistor 17 may be set at approximately 0 volts. Further, the current flowing in the diode 34 is small, therefore the area thereof may be reduced; making it easier to integrate the circuit.

In the microwave feedback circuit, the input impedance must not change if the gain of the amplifier changes. This object is achieved by using the circuit shown in FIG. 9.

Figure 9:
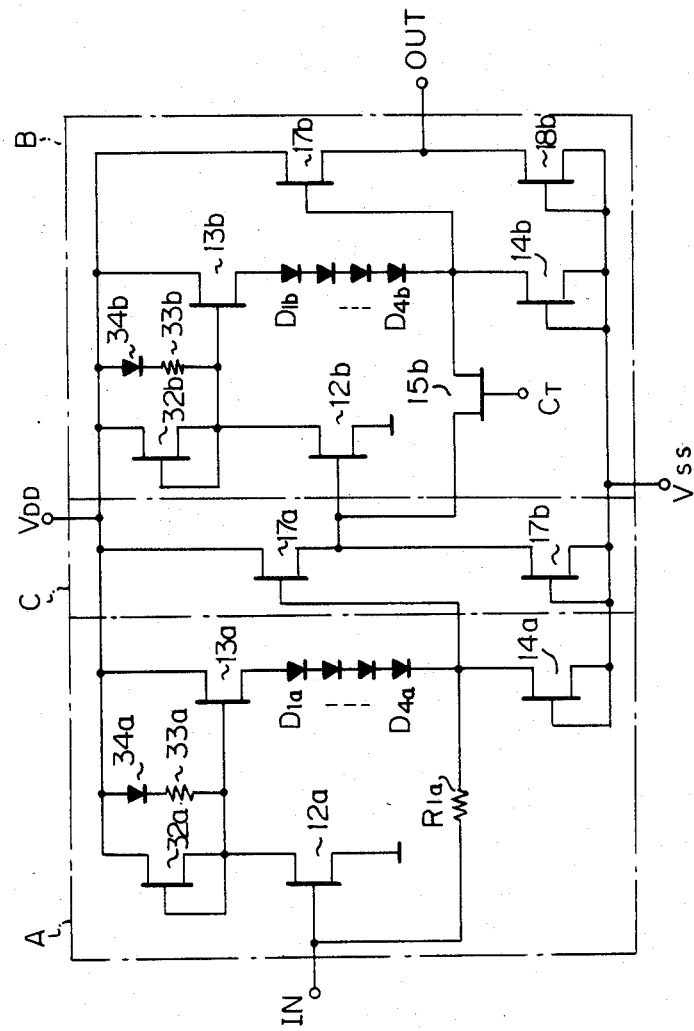
FIG. 9 is a circuit diagram of an eighth embodiment of the feedback amplifier according to the present invention.
Figure 10:
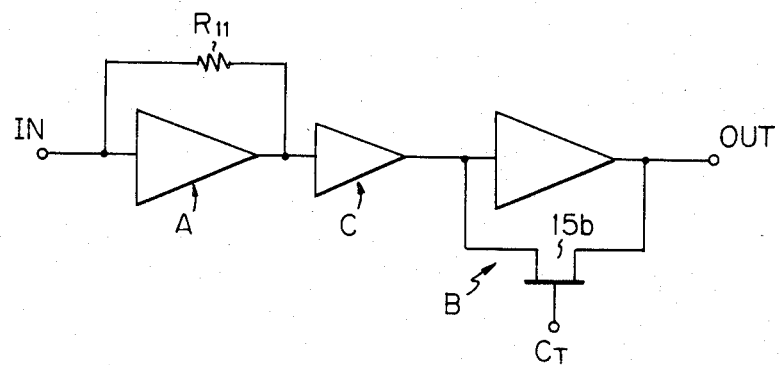
FIG. 10 is a block diagram of the feedback amplifier shown in FIG. 9.

In the circuit in FIG. 9, a constant gain feedback portion A is formed by transistors 12a, 32a, 13a, and 14a, resistors R1a and 33a, and diodes $D_{1a}$, $D_{2a}$, $D_{4a}$, and 34a a variable gain feedback portion B is formed by transitsors 12b, 32b, 13b, 14b, 15b, 17b, and 18b, resistors 33b, and diodes $D_{1b}$, $D_{2b}$, $D_{3b}$, $D_{4b}$, and 36b, and a buffer portion C is formed by transitsors 17a and 17b and inserted between the portions A and B. FIG. 10 is a block diagram of the circuit shown in FIG. 9. In the portion A, as already mentioned, the gain and the output level can be easily set. Further, the load of the transistor 12a can be replaced by only the transistor 32a or only the resistor 33a. In the portion B, the gain and the output level can be also easily set, and the load of the transistor 12b can be replaced by only the transistor 32b. Therefore, if the feedback amount of the portion B is changed by changing the control signal $C_T$ of the transistor 15b, the effect is inhibited by the buffer portion, so that it does not affect portion A. Thus it is clear that, in the circuit shown in FIG. 9, the input impedance does not change if the gain is changed, and a wideband variable gain amplifier having a frequency band from DC to several GHz can be formed.

Figure 11:
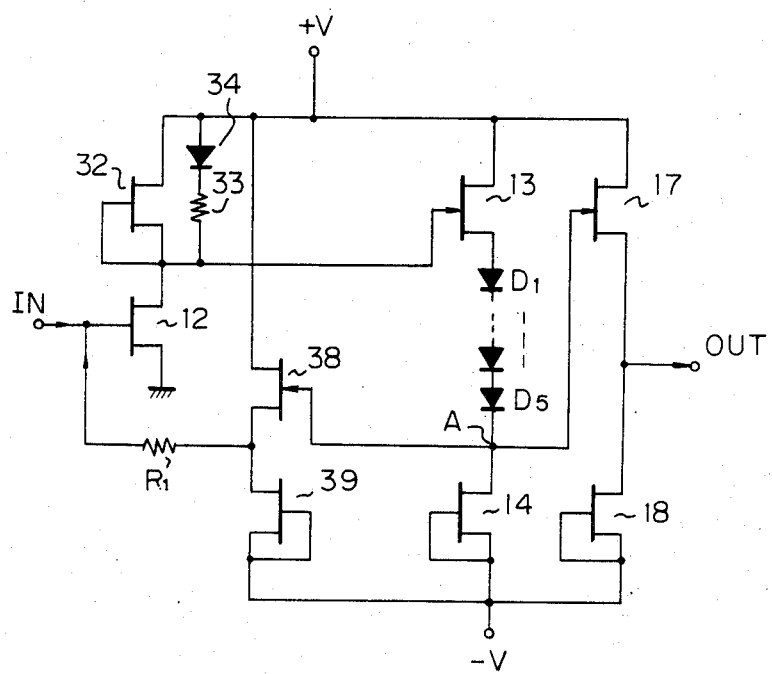
FIG. 11 is a circuit diagram of a ninth embodiment of the feedback amplifier according to the present invention.

To further extend the frequency band or the gain of the feedback amplifier, the circuit shown in FIG. 11 is used. In the circuit shown in FIG. 11, a buffer circuit including transistors 38 and 39, having a gate length of 1.5 μm and a gate width of 80 μm, is provided in the feedback path. By providing this buffer circuit, the frequency band and the gain can be extended from 3.7 GHz and 10.9 db (no buffer circuit) to 3.5 GHz and 13.9 db. That is, although the frequency band is not changed, the gain is increased. Thus, if the gain does not change, the frequency band can be extended. For example, when the value of the resistor 33 is assumed to be 250 Ω, and the feedback resistor is assumed to be 200 Ω, the frequency band become 4 GHz and the gain becomes 11.0 db. Therefore, if the load resistor of the transistor 12 is small, sufficient gain can be obtained. This means that the passiave load resistor can be used as the load of the inversion circuit because the impedance of the input side from point A becomes very much higher than that of the buffer circuit, including the transistors 38 and 39, and the gain of the buffer circuit decreases in the high frequency portion, decreasing the amount of feedback.

Figure 12:
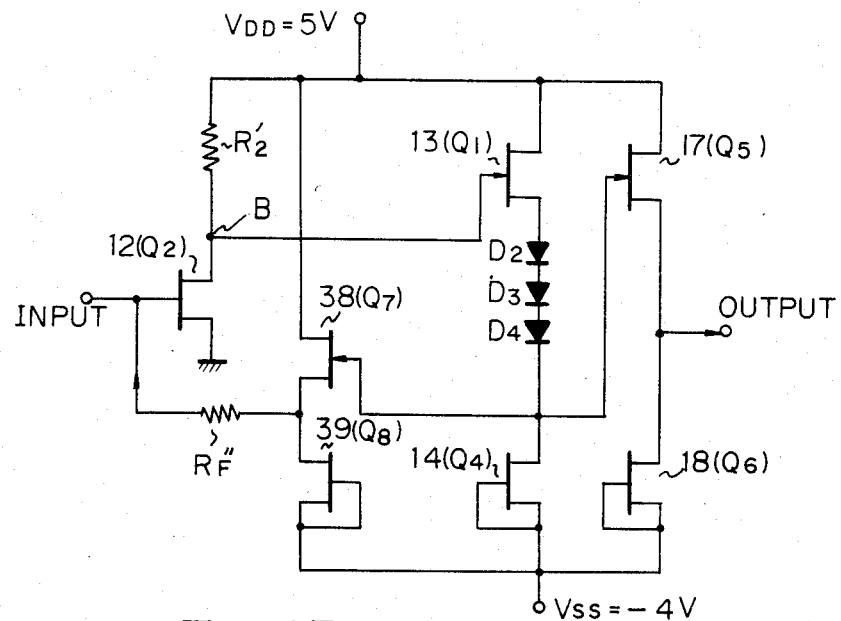
FIG. 12 is a circuit diagram of a tenth embodiment of the feedback amplifier according to the present invention.

In the circuit shown in FIG. 12, only the resistor $R'_2$ is used as the load of the invention circuit. In FIG. 12, the electric potential at point B is decreased more than that in FIG. 11, and thus, the number of the level shift diodes can be decreased. Further, the buffer transistors $Q_7$ and $Q_8$ are about half the size of the diodes $D_2$ to $D_4$, therefore, the total area of the circuit can be considerably decreased.

Figure 13:
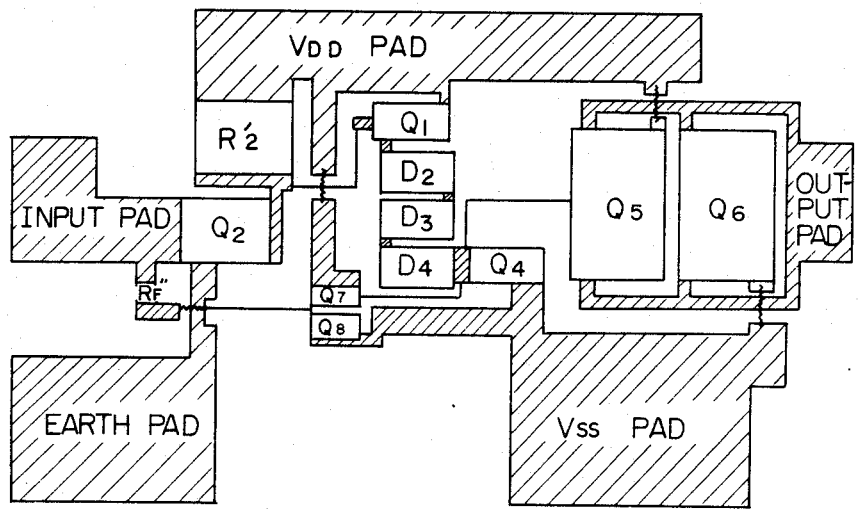
FIG. 13 is a pattern diagram of the feedback amplifier shown in FIG. 12, formed on a chip.

FIG. 13 shows a pattern arrangement of the feedback amplifier, shown in FIG. 12, on a chip. Since the pattern shown in FIG. 13 does not include a capacitor, the area of the pattern is decreased by about one-tenth of that used by the prior art.

According to the present invention, a feedback amplifier does not require a feedback capacitor. Accordingly, when such a feedback amplifier is integrated on a GaAs substrate, or the like, to form a device, the chip can be more effectively utilized. The amplifier of the present invention is also capable of operating from a D.C. input voltage.

We claim:

1. A feedback amplifier operatively connectable to an electric source and operatively connectable to receive a control voltage, comprising:
    an inversion circuit, having an input terminal and an output terminal, comprising:
        an input active element including a dual gate transistor having a first gate operatively connected to the input terminal of said inversion circuit; and
        a load element operatively connected in cascade with said input active element and the electric source;
    a constant current active load operatively connected to the electric source;
    a level shift circuit having an output terminal and comprising:
        a first field effect transistor having a gate operatively connected to the output terminal of said inversion circuit; and
        at least one diode operatively connected between said field effect transistor and said constant current active load;
    a feedback resistive element operatively connected between the output terminal of said level shift circuit and the input terminal of said inversion circuit, and operatively connected to a second gate of said dual gate transistor of said active input element, said feedback resistive element including a second field effect transistor having a gate terminal for receiving the control voltage so as to vary the value of the feedback resistance and a first resistor operatively connected in parallel with said second field effect transistor.

2. A feedback amplifier operatively connectable to an electric source, comprising:
    an inversion circuit, having an input terminal and an output terminal, comprising:
        an input active element; and
        a load element operatively connected in cascade with said input active element and the electric source, the load element including a first field effect transistor having a gate terminal and having a source terminal operatively connected to the gate terminal, and a first resistor operatively connected in parallel with said first field effect transistor;
    a constant current active load;
    a level shift circuit, operatively connected to said constant circuit active load, having an output terminal, and comprising:
        a second field effect transistor having a gate operatively connected to the output terminal of said inversion circuit; and
        at least one diode operatively connected between said second field effect transistor and said constant current active load;
    a feedback resistive element comprising a second resistor, operatively connected between the output terminal of said level shift circuit and the input terminal of said inversion circuit; and
    a buffer circuit operatively connected between the output terminal of said level shift circuit and said second resistor.

3. A feedback amplifier according to claim 2, wherein said load element comprises a second resistor.

4. A feedback amplifier according to claim 2, wherein said constant current active load comprises a field effect transistor having a gate terminal, having a source terminal operatively connected to the gate terminal and having a drain terminal operatively connected to said at least one diode of said level shift circuit.

5. A feedback amplifier according to claim 2, wherein said buffer circuit comprises:
    a third field effect transistor having a source, having a drain operatively connected to the electric source and having a gate operatively connected to the output terminal of said level shift circuit; and
    a fourth field effect transistor having a drain operatively connected to the source of said third field effect transistor and to said feedback resistor, having a gate and having a source operatively connected to the gate.

* * * * *